United States Patent
Graesslin et al.

(10) Patent No.: US 7,615,997 B2
(45) Date of Patent: Nov. 10, 2009

(54) SIMULTANEOUS MR-EXCITATION OF MULTIPLE NUCLEI WITH A SINGLE RF AMPLIFIER

(75) Inventors: Ingmar Graesslin, Boenningstedt (DE); Tobias Schaeffter, Hamburg (DE); Paul R. Harvey, Best (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 12/091,303
(22) PCT Filed: Oct. 3, 2006
(86) PCT No.: PCT/IB2006/053616

§ 371 (c)(1),
(2), (4) Date: Apr. 24, 2008

(87) PCT Pub. No.: WO2007/066244

PCT Pub. Date: Jun. 14, 2007

(65) Prior Publication Data

US 2008/0265890 A1    Oct. 30, 2008

Related U.S. Application Data

(60) Provisional application No. 60/731,354, filed on Oct. 28, 2005.

(51) Int. Cl.
G01V 3/00 (2006.01)
(52) U.S. Cl. .................... 324/314; 324/322
(58) Field of Classification Search .......... 324/314, 324/322, 318
See application file for complete search history.

(56) References Cited

U.S. PATENT DOCUMENTS

| | | | |
|---|---|---|---|
| 4,446,431 A * | 5/1984 | McKay | 324/322 |
| 5,064,638 A * | 11/1991 | Moore et al. | 324/310 |
| 5,170,123 A | 12/1992 | Holland et al. | |
| 5,243,289 A * | 9/1993 | Blum et al. | 324/322 |
| 5,446,384 A | 8/1995 | Dumoulin | |
| 6,081,120 A | 6/2000 | Shen | |
| 2004/0047429 A1 | 3/2004 | Hsu | |

FOREIGN PATENT DOCUMENTS

| EP | 0412747 A2 | 2/1991 |
|---|---|---|
| EP | 1416291 A2 | 6/2004 |

OTHER PUBLICATIONS

Jesmanowicz, A., et al.; "Simultaneous Acquisition of Echo Planar Images on Proton and Phosphor Frequencies"; 2002; Proc.Intl.Soc. Mag.Reson.Med.; 10: 2501, Conference Abstract.
Vaughan, JT, et al.; "RF Image Optimization at 7T & 9.4T"; May 2005; Proc.Intl.Soc.Mag.Reson.Med.; 13: 953, Conference Abstract.
Lou, Th et al.; "Simultaneous Imaging of Proton and Fluorine at Moderate Field"; Dec. 1992; Magnetic Resonance in Medicine; 28(2): 300-304.

(Continued)

Primary Examiner—Louis M Arana

(57) ABSTRACT

A medical imaging system (2) excites multiple nuclei through a single RF amplifier (24). The medical imaging system (2) includes a magnet (10) that generates a main magnetic field (Bo) in an examination region. A gradient coil (14) superimposes magnetic field gradients (G) on the main magnetic field Bo. At least one transmitter (28) generates multi-nuclei excitation pulses associated with at least two different isotopes and two different frequency spectra. The single amplifier (24) sends the multi-nuclei excitation pulses to a RF coil (18, 20) for application to the examination region.

15 Claims, 7 Drawing Sheets

OTHER PUBLICATIONS

Lee, SW et al.; "A Multinuclear Magnetic Resonance Imaging Technique—Simultaneous Proton and Sodium Imaging"; 1986; Magnetic Resonance Imaging; 4: 343-350.

Kozerke, et al.; "Catheter Tracking and Visualilzation Using 19F Nuclear Magnetic Resonance"; 2004; Magn. Reson. Med., 52(3): 693-697.

Ibrahim, et al.; "Effect of RF Coil Excitation on Field Inhomogeneity at Ultra High Fields: A Field Optimized TEM Resonator", Mag. Reson. Imaging, Dec. 2001; 19(10): 1339-47.

Katscher, et al.; "Transmit Sense", Magn. Reson. Med., Jan. 2003; 49(1); 144-50.

* cited by examiner

SIMULTANEOUS MR-EXCITATION OF MULTIPLE NUCLEI WITH A SINGLE RF AMPLIFIER

CROSS REFERENCE TO RELATED APPLICATIONS

This application claims the benefit of U.S. provisional application Ser. No. 60/731,354 filed Oct. 28, 2005, which is incorporated herein by reference.

The following relates to medical imaging. It finds particular application to concurrent multiple nuclei magnetic resonance imaging. Of course, the invention is also applicable to sequential and/or concurrent excitation of multiple nuclei within a subject for spectroscopy or imaging.

Conventional Magnetic Resonance (MR) scanners use high power (e.g., 20-35 kilowatt) vacuum tube radio frequency (RF) amplifiers to excite RF gradient coils. Typically, such amplifiers have relatively limited bandwidth and are only designed to the excitation frequency of a single nucleus such as proton resonance associated with hydrogen. In order to excite another nuclei associated with a different isotope, such scanners include an additional separate amplifier (e.g., one for each isotope of interest).

With a typical multi-nuclei scanner, each amplifier receives excitation pulses from a corresponding transmitter, which is configured to generate a plurality of excitation pulses in a spectrum around the resonance frequency of a particular isotope. The amplifiers are also connected to corresponding RF coils. During excitation, pulses from an associated amplifier energize an associated RF coil, which is frequency-tuned to the particular isotope. The RF coil performs the excitation pulses in a magnetized subject. During data readout, a switch connects the RF coil or a receive only coil to a receiver. MR signals generated from processing nuclei within the subject are received by the RF coil and conveyed to the receiver. The acquired MR signals are processed to produce one or more images of the subject, or the like.

A consequence associated with using one or more additional amplifiers for multi-nuclei excitation includes increased hardware, software, and/or cost. Furthermore, multi-nuclei images are often overlaid for anatomy localization. When each isotope is imaged in a separate process, registration routines typically have to be used to mitigate image miss-registration as well as to compensate for different field of views due to different gyromagnet ratios.

In view of the aforementioned as well as other deficiencies with conventional MR scanners, there is an unresolved need for improved MR systems and techniques.

In one embodiment, a medical imaging system that excites multiple nuclei through a single RF amplifier is illustrated. The medical imaging system includes a magnet that generates a main magnetic field ($B_0$) in an examination region. A gradient coil superimposes magnetic field gradients (G) on the main magnetic field $B_0$. At least one transmitter generates multi-nuclei excitation pulses associated with at least two different isotopes and two different frequency spectra. The single amplifier sources the multi-nuclei excitation pulses to a RF coil for excitation into the examination region.

One advantage includes concurrently exciting multiple nuclei through a single RF amplifier.

Another advantage resides in sequentially exciting multiple nuclei through a single RF amplifier.

Another advantage resides in reducing the number of amplifiers relative to conventional multi-nuclei scanners.

Still further advantages will become apparent to those of ordinary skill in the art upon reading and understanding the detailed description of the preferred embodiments.

The drawings are only for purposes of illustrating working embodiments and are not to be construed as limiting the invention.

Figure 1:
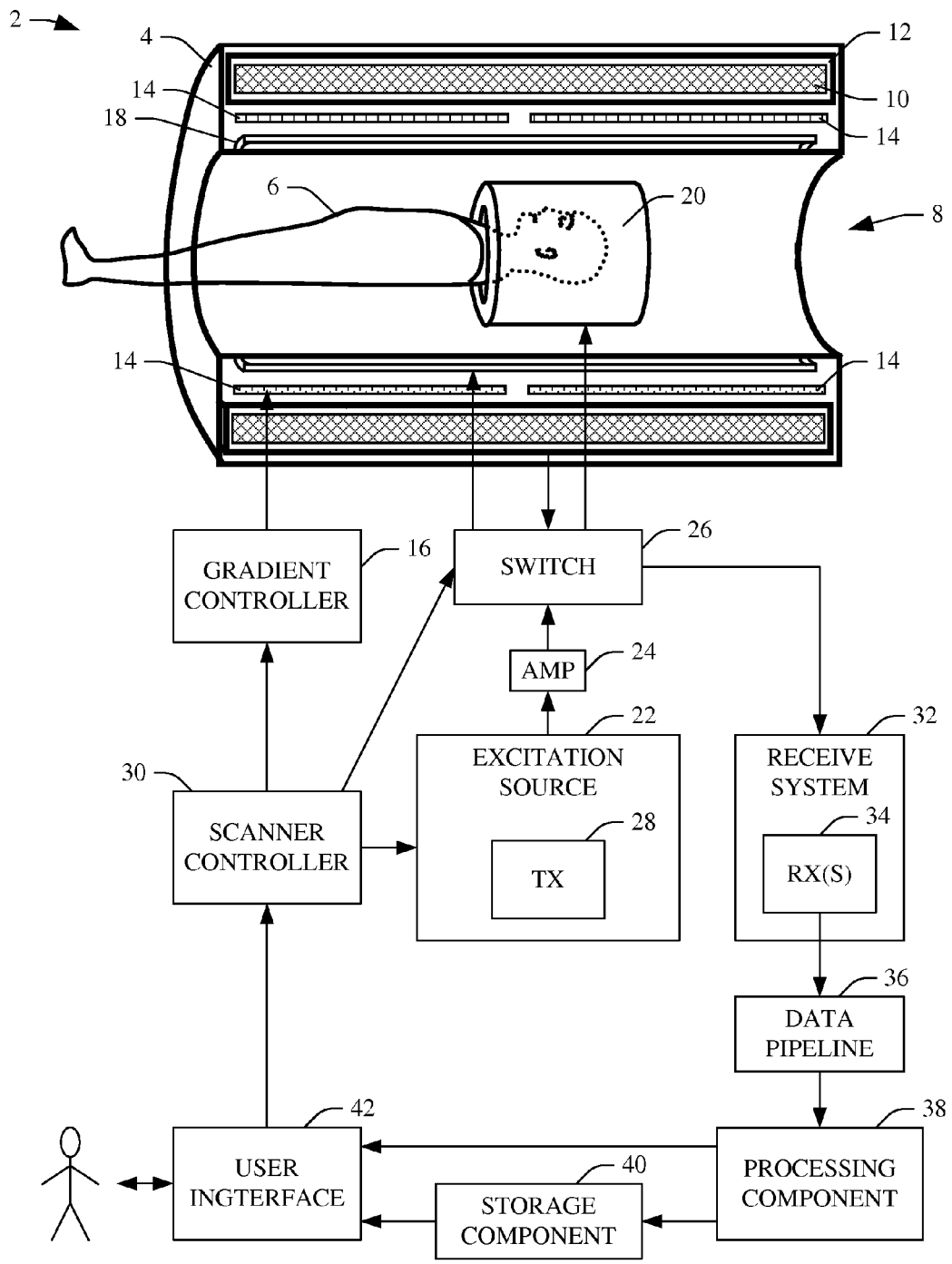
FIG. 1 illustrates an imaging system that excites multiple nuclei within a subject through a single RF amplifier.

FIG. 1 illustrates an imaging system 2 that excites multiple nuclei (e.g., associated with isotopes such as $^1H$, $^{19}F$, $^{13}C$, $^{31}P$, etc.) within a subject through a single RF amplifier. The system 2 includes a housing 4. A subject 6 (e.g., a human, an object, etc.) is at least partially disposed within a bore 8 of the housing 4 for one or more imaging procedures (e.g., spin echo, gradient echo, stimulated echo, etc.). A magnet 10 resides in the housing 4. The magnet 10 typically is a persistent superconducting magnet surrounded by a cryo shrouding 12. However, other known magnets (e.g., a resistive magnet, a permanent magnet, etc.) can be employed. The magnet 10 produces a stationary and substantially homogeneous main magnetic field $B_0$ in the subject 6. As a result, the nuclei within the subject 6 preferentially align in a parallel and/or an anti-parallel direction with respect to the magnetic flux lines of the magnetic field $B_0$. Typical magnetic field strengths are about 0.5 Tesla (0.5 T), 1.0 T, 1.5 T, 3 T or higher (e.g., about 7 T).

Magnetic field gradient coils 14 are arranged in and/or on the housing 4. The coils 14 superimpose various magnetic field gradients G on the magnetic field $B_0$ in order to define an imaging slice or volume and to otherwise spatially encode excited nuclei. Typical gradient field strengths are about 5 mT/m to about 20 mT/m but even up to 80 mT/m. The magnetic field gradient coils 14 typically produce orthogonal magnetic field gradients. For instance, these coils generate $G_z$, $G_y$, and/or $G_x$ gradients in a Cartesian plane. Such gradients correspond to a set of axes defining a volume of the subject 6 and enable spatial information to be obtained from the subject 6. Image data signals are produced by switching gradient fields in a controlled sequence by a gradient controller 16.

One or more radio frequency (RF) coils or resonators are used for single and/or multi-nuclei excitation pulses within an imaging region. Suitable RF coils include a full body coil 18 located in the bore 8 of the system 2, a local coil (e.g., a head coil 20 surrounding a head of the subject 6), and/or one or more surface coils. Each of the RF coils 18 and/or 20 can be tuned for a single isotope (e.g., a single frequency band) or multiple isotopes (e.g., more than one frequency band). The excitation pulses create a magnetic field $B_1$, perpendicular to $B_0$, which displaces the magnetization of the nuclei, invoking the nuclei to precess at a frequency determined by the field strength. As the nuclei precess back to an equilibrium state, magnetic resonance signals are emitted.

An excitation source 22 generates the single and/or multi-nuclei excitation pulses and provides these pulses to the RF coils 18 and/or 20 through an amplifier 24 and a switch 26. The excitation source 22 includes at least one transmitter (TX) 28, which is associated with one or more signal generators or oscillators (not shown) that generate excitation pulses in a defined frequency range corresponding to a resonance frequency of each selected isotope and a frequency spread corresponding to the applied gradients. The transmitter 28 generates and transmits excitation pulses in the spectra for individual isotopes and/or multi-nuclei excitation pulses in which each pulse includes combined or superimposed excitation pulses associated with different isotopes. For instance, each multi-nuclei excitation pulse can include excitation pulses associated with two or more of $^1H$, $^{19}F$, $^{13}C$, $^{31}P$, etc. isotopes.

The transmitter 28 combines the excitation pulses for each isotope through either digital or analog techniques. In the digital domain, nuclei amplitude, phase, and/or frequency are updated based on a difference between nuclei frequencies. For example, when combining excitation pulses associated with Hydrogen (about 127.8 MHz at 3.0 T) and Fluorine (about 120 MHz) isotopes, amplitude, phase, and/or frequency are updated on the order of several megahertz. In the analog domain, digital demand signals are first converted to analog signals, which are then combined at lower power relative to the digital domain.

A scanner controller 30 controls the excitation source 22 based on operator instructions. For instance, if an operator selects a protocol for acquisition of proton spectra, the scanner controller 30 accordingly instructs the excitation source 22 to generate excitation pulses at a corresponding frequency, and the transmitter 28 generates and transmits the pulses to the RF coils 18 or 20 via the amplifier 24. In another instance, if an operator selects a protocol for sequential or concurrent acquisition of multiple spectra for multiple isotopes, the scanner controller 30 instructs the excitation source 22 to generate excitation pulses for each isotope. For sequential acquisition, the excitation pulses for the isotopes are transmitted in an interleaved manner to the amplifier 24. By interleaving the pulses, the coils 18 or 20 (or elements of them) are alternately energized by the excitation pulses of the different isotopes. For concurrent data acquisition, the transmitter 28 generates the excitation pulses for each isotope and combines them (e.g., through digital or analog techniques) to produce multi-nuclei excitation pulses, which concurrently excite the coils 18 or 20 at different frequencies. In this case, these are tuned, for example, to different frequencies (multi-tuned).

The single or multi-nuclei excitation pulses are fed to the single amplifier 24, which preferably is a solid-state RF amplifier that is more broadband than vacuum tube amplifiers. Conventional imaging systems typically utilize multiple amplifiers, in case more than one excitation spectra is used. Thus, the present application reduces the number of amplifiers to one. The reduction in amplifiers reduces cost and design complexity.

The single or multi-nuclei excitation pulses are sent from the amplifier 24 to the coils 18 or 20 through the switch 26. The scanner controller 30 also controls the switch 26. During an excitation phase, the scanner controller 30 controls the switch 26 and allows the single or multi-nuclei excitation pulses to pass through the switch 26 to the RF coils 18 or 20, but not to a receive system 32. Upon receiving the single or multi-nuclei excitation pulses, the RF coils 18 or 20 resonate and apply the pulses into the imaging region. The gradient controller 16 suitably operates the gradient coils 14 to spatially encode the resulting MR signals.

During the readout phase, the switch 26 connects the receive system 32 to one or more receive coils to acquire the spatially encoded MR signals. Either separate receive coils are used for each isotope (which has a signal-to-noise advantage) or one or more multi-tuned receive coils are used for multiple isotopes. Examples of suitable receive coils include the full body coil 16, the head coil 18, and/or various other coils such as surface coils (not shown) positioned proximate anatomy (e.g., spine, breast, knee, etc.) of interest, quadrature coils, phased array coils, etc. The received MR signals are conveyed (e.g., via wire and wireless techniques) to the receive system 32.

The receive system 32 includes one or more receivers 34 depending on the receive coil configuration, which includes at least one of the following: a plurality of receive coils, each tuned to receive a MR signal at a frequency associated with a particular isotope and each using a distinct transmission line; a plurality of receive coils sharing a transmission line and each tuned to receive a MR signal at a frequency associated with a particular isotope; and/or one or more receive coil tuned to receive MR signals at multiple frequencies, each frequency corresponding to a different isotope. With systems that use a plurality of receive coils, each tuned to a particular isotope and each having a distinct transmission line, each of the receivers 34 is associated with componentry (e.g., digital-to-analog converters, demodulators, etc.) that processes the incoming MR signal into a suitable format to facilitate image reconstruction. In systems with multi-tuned coils and/or individual coils that share a transmission line, each of the receivers 34 also includes and/or is associated with componentry that splits or filters (e.g., band pass) the incoming MR signals to separate the individual MR signals by frequency or isotope.

The acquired MR signals are conveyed (serially and/or in parallel) through a data pipeline 36 and processed by a processing component 38 to produce one or more images. The processing component 38 employs various reconstruction algorithms that suitably decode the spatially encoded magnetic resonances. For example, if Cartesian encoding is employed, a two or three dimensional fast Fourier transform (FFT) reconstruction algorithm typically is used.

The reconstructed images are stored in a storage component 40 and/or displayed on an interface 42, other display device, printed, communicated over a network (e.g., the Internet, a local area network (LAN) . . . ), stored within a storage medium, and/or otherwise used. The interface 42 also allows an operator to control the magnetic resonance imaging scanner 2 through conveying instructions to the scanner controller 30.

Figure 2:
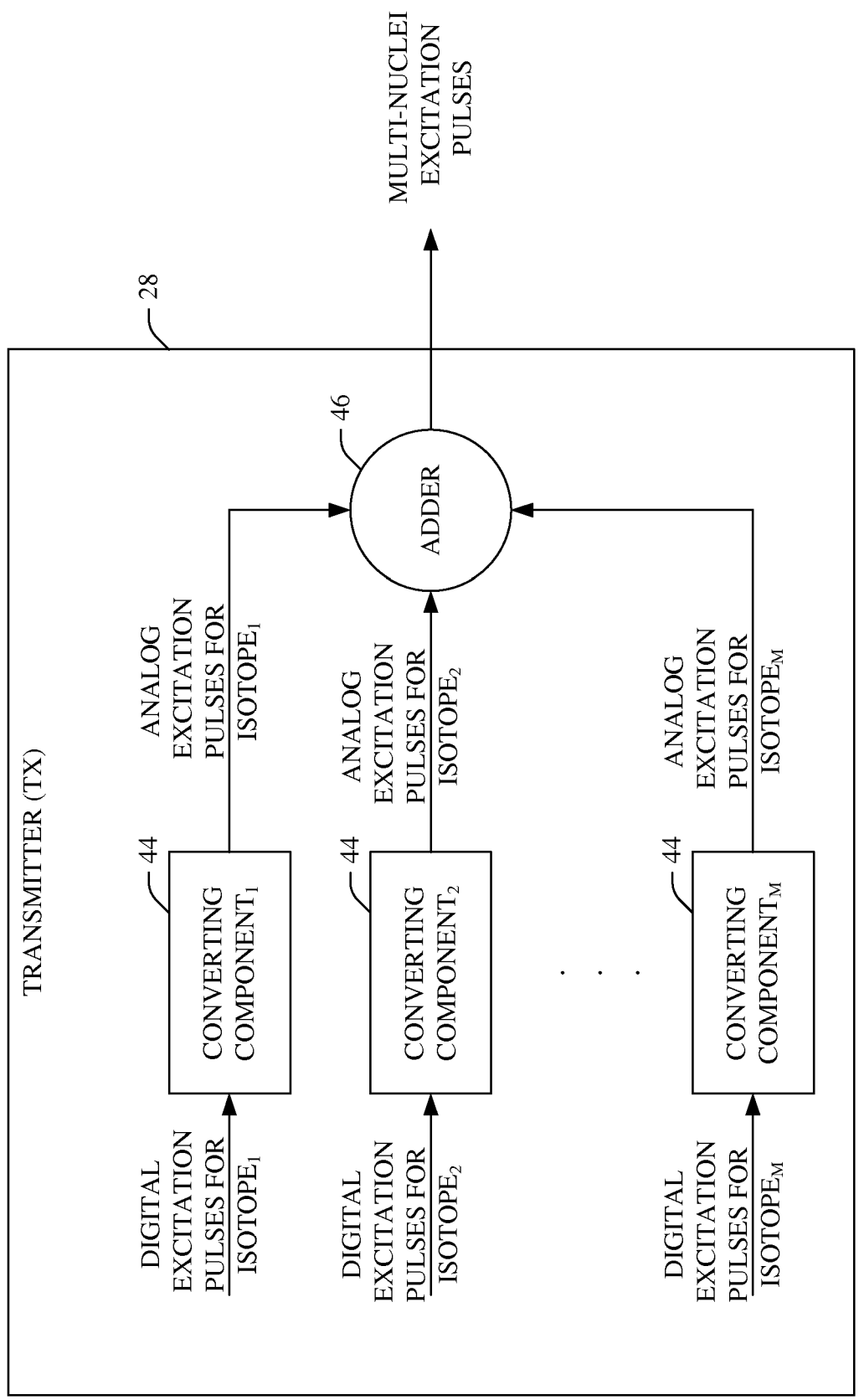
FIG. 2 illustrate an exemplary technique for combining individual excitation pulses associated with different isotopes in the analog domain to create multi-nuclei excitation pulses.

As previously discussed, the excitation source 22 includes at least one transmitter 28, which utilizes digital and/or analog techniques to combine excitation pulses associated with different isotopes to generate multi-nuclei excitation pulses. FIG. 2 illustrate an exemplary technique for combining excitation pulses in the analog domain. The transmitter 28 includes a plurality of signal converting components 44 (e.g., analog-to-digital converters, direct digital synthesizers, band pass filters, etc.) that each receive digital excitation pulses generated for different isotopes. Each of the plurality of signal converting components 44 converts received excitation pulses to analog signals. The analog signals are fed to an adding unit 46, which combines the excitation pulses in the analog domain to produce multi-nuclei excitation pulses. The multi-nuclei excitation pulses are then conveyed to the RF coil 18 or 20 via the amplifier 24 as described in detail above.

Figure 3:
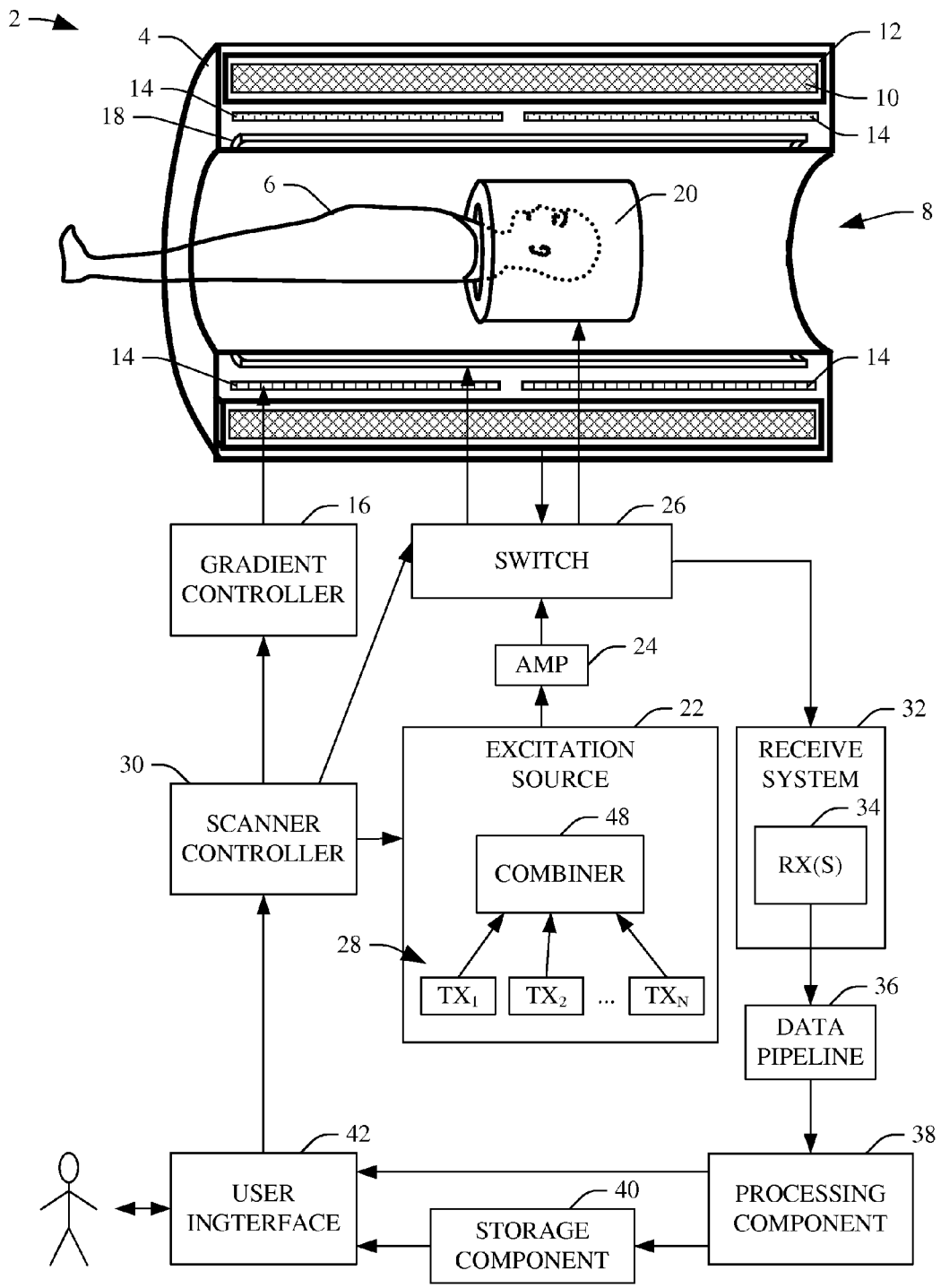
FIG. 3 illustrates a multi-transmitter imaging system that excites multiple nuclei within a subject through a single RF amplifier.

FIG. 3 illustrates a multi-transmitter embodiment in which the excitation source 22 of the scanner 2 includes a plurality of the transmitters $TX_1$, $TX_2$, . . . TX, 28 each of which generates excitation pulses for a single isotope in response to instructions from the scanner controller 30. The single isotope excitation pulses from two or more of the transmitters 28 are combined to form multi-nuclei excitation pulses that are fed to the RF coil 18 or 20 via the amplifier 24. In one instance, a combiner 48 combines the individual excitation pulses by concurrently (e.g., pair-wise, three at a time, . . . , all) superimposing excitation pulses from each of the transmitters 28. As depicted, the combiner 48 can reside within the excitation source 22. However, in other embodiments, the combiner 48 resides outside of the excitation source 22 as a separate component and/or as part of another component. The resulting multi-nuclei excitation pulses are used to sequentially or concurrently energize the RF coil 18 or 20, which can be single and/or multi-tuned coils, as described above. The resulting MR signals associated with each isotope are captured by single and/or multi-tuned receiving coils, provided (e.g., wire and wirelessly) to the receive system 32, and subsequently processed by the processing component 38 to generate one or more images.

Figure 4:
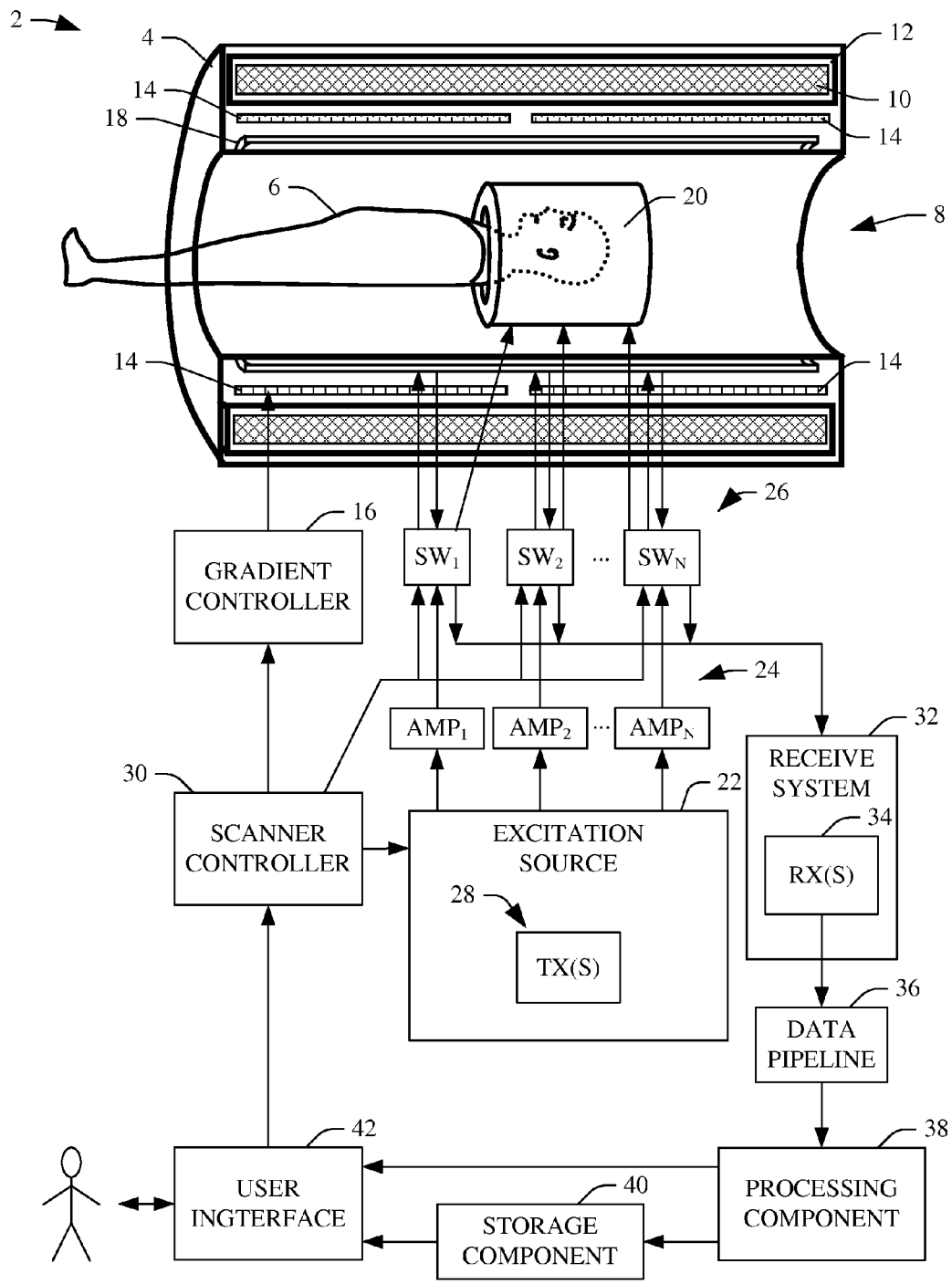
FIG. 4 illustrates a multi-channel imaging system that excites multiple nuclei at a channel via multi-nuclei excitation pulses conveyed through a corresponding single RF amplifier associated with the channel.

FIG. 4 illustrates the scanner 2 having a RF coil with a plurality of channels or rods (not shown) that are each independently tuned for one or more isotopes. In such configuration, each channel typically is associated one of a plurality of the amplifiers 24 ($AMP_1$, $AMP_2$, . . . , $AMP_N$) and one of a plurality of the switches 26 ($SW_1$, $SW_2$, . . . , $SW_N$). Each channel is also associated with one or more transmitters 28 (TX(S)). Multi-nuclei excitation pulses are generated at each of the transmitters 28 and/or by combining individual excitation pulses from each of the transmitters 28, for example, through the adder 46 of FIG. 2, the combiner 48 described in connection with FIG. 3, or similar component. The multi-nuclei excitation pulses are then conveyed to one or more of the channels through the one or more associated amplifiers 24.

By way of example, one of the transmitters 28 may be instructed by the scanner controller 30 and/or the excitation source 22 to convey multi-nuclei excitation pulses to a first channel (not shown) via an $AMP_1$ and a $SW_1$. Serially and/or concurrently, one of the transmitters 28 (including a similar transmitter 28) may be instructed to convey multi-nuclei excitation pulses to a second channel (not shown) via an $AMP_2$ and a $SW_2$. Serially or concurrently, one of the transmitters 28 (including a similar transmitter 28) may be instructed to convey multi-nuclei excitation pulses to a N-th channel (not shown) via an $AMP_N$ and a $SW_N$, where N is an integer equal to or greater than one. In another embodiment, more than one of the transmitters 28 is instructed to generate excitation pulses and the multi-nuclei excitation pulses are created by combining (e.g., with the combiner 28 described in connection with FIG. 2) the (single and/or multi-nuclei) excitation pulses generated by the individual transmitters 28. The same multi-nuclei excitation pulses are then serially and/or concurrently conveyed to one or more of the amplifiers 24.

It is to be appreciated that the foregoing example is provided for illustrative purposes and is not limiting. For instance, although each of the transmitters 28 is configured to transmit multi-nuclei excitation pulses, the scanner 2 can operate such that some of the transmitters 28 transmit excitation pulses for one isotope while other transmitters 28 transmit excitation pulses for a different isotope. In addition, the excitation pulses being transmitted by any one of the transmitters 28 can change from excitation pulses associated with one isotope to excitation pulses associated with a different isotope. In another instance, the scanner 2 can operate such that some of the transmitters 28 transmit excitation pulses for more than one isotope while other transmitters 28 transmit excitation pulses for an individual isotope.

On the receive side, each channel and/or other channels/coils can be used as receive channels, and each receive channel is either tuned for a single or multiple isotopes. Typically, each channel is associated with one of the receivers 34 of the receive system 32. In some instance, one or more of the channels are associated with a plurality of similar and/or different receivers 34. In instances in which the receive system 32 only includes a single receiver 34, that receiver is associated with substantially all of the channels.

The MR signal captured by any one of the channels is conveyed to the associated receiver(s) 34. MR signal conveyance from multiple channels can be achieved serially and/or in parallel. Depending on whether the receive channel is single or multi-tuned, each of the receivers 34 may include and/or be associated with componentry that splits, separates, or filters (e.g., band pass) incoming MR signals to extract MR signals associated with a particular isotope and/or various other componentry that splits, filters, processing, amplifies, conditions, etc. received MR signals. The individual MR signals are subsequently processed by the processing component 38 to generate one or more images.

Figure 5:
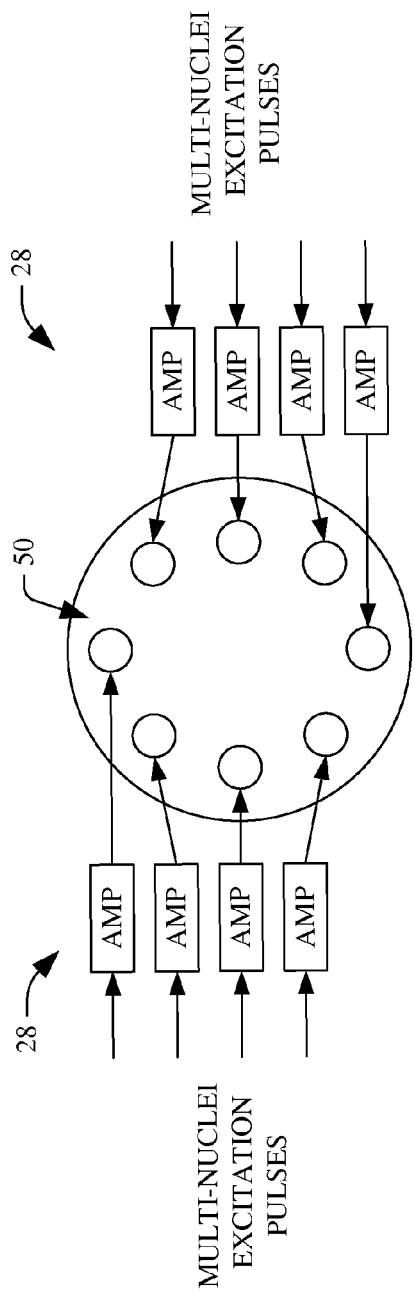
FIG. 5 illustrates a plurality of channels that are independently tuned for multiple frequencies associated with multiple isotopes.
Figure 6:
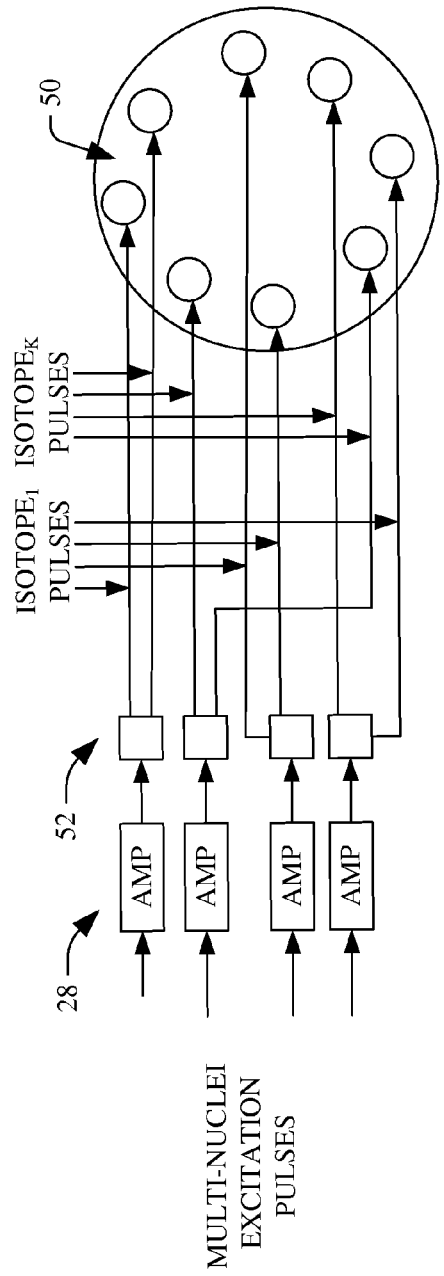
FIG. 6 illustrates a plurality of channels used in an interleaved manner to excite one or more of the channels with pulses corresponding to different isotopes.

FIG. 5 illustrates an embodiment of the scanner 2 with a plurality of channels 50 that are independently tuned for multiple frequencies associated with multiple isotopes. The channels 50 are configured as an array of flexible surface coils and used in a serial and/or concurrent manner, wherein multi-nuclei excitation pulses are fed from individual amplifiers 28 to individual channels 50. FIG. 6 illustrates an alternative embodiment in which the channels 50 are used in an interleaved manner. With this embodiment, the multi-nuclei excitation pulses are separated by individual splitters 52, wherein excitation pulses for the different isotopes are fed to different channels 50 in an interleaved manner. For clarity, the multi-nuclei excitation pulses are split into excitation pulses for two different isotopes. However, it is to be understood that the multi-nuclei excitation pulses can include excitation pulses for more than two isotopes. With these embodiments, a plurality of amplifiers are used to reduce power per channel (i.e., the power per channel is reduced by about the number of channels). In addition, only two amplifiers are connected to two coil elements in order to have the same number of amplifiers as elements.

The resulting $B_1$ field is a superposition of the individual RF TX/RX coils. Alternatively, the channels 50 are used for excitation, while surface coils are used together or individually for reception. On the receive side, each of the channels 50 is tuned as described above, for example, to receive MR signals associated with a particular isotope and/or two or more different isotopes.

Figure 7:
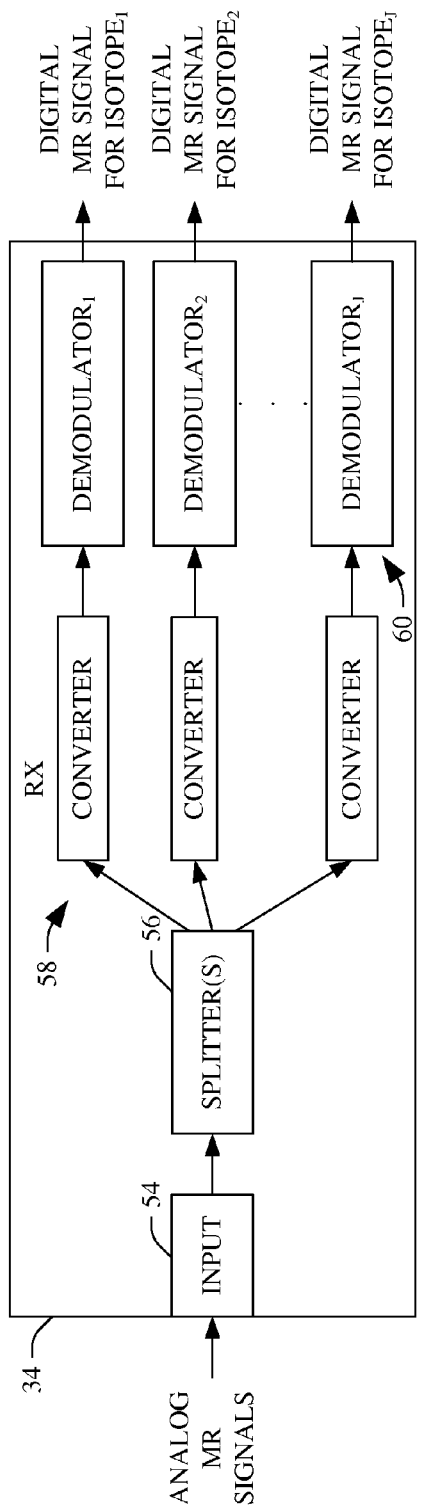
FIG. 7 illustrates an exemplary receive system having one receiver and used to concurrently receive multiple MR signals at a single input.
Figure 8:
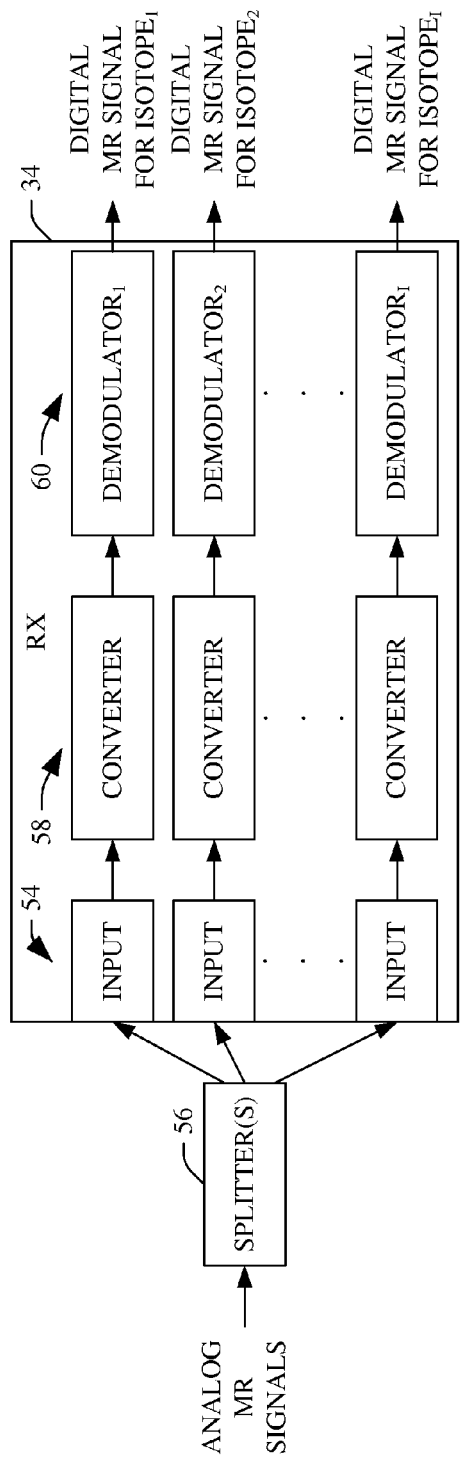
FIG. 8 illustrates an exemplary receive system having one receiver and used to serially and/or concurrently receive individual MR signals at different inputs.

FIGS. 7 and 8 illustrate exemplary receive systems 32 having one receiver 34. With respect to FIG. 7, multiple analog MR signals are concurrently received at a single input 54 of the receiver 34. The MR signals can be from a multi-tuned receive coil, more than one multi-tuned coil sharing a common data path, and/or a plurality of individually tuned coils sharing a common data path. The receiver 34 includes one or more splitters 56 (e.g., band pass filters, diplexers, or multiplexers). Each of the splitters 56 is configured to pass one or more MR signals from the incoming multiple MR signals, based on a frequency band. The receiver 34 further includes one or more converters 58. MR signals passing through the splitters 56 are converted to individual digital signals corresponding to the different isotopes by the converters 58. The receiver 34 further includes a plurality of demodulators 60, one for each isotope. The demodulators 60 demodulate the digital signals from the converters 58. The resulting signals are conveyed over the data pipeline 36 to the reconstruction system 38 for image generation as described above.

In FIG. 8, the multiple analog MR signals are separated prior to being received by the receiver 34. Separating the individual MR signal can be achieved at the receiving coil and/or by the splitter 56 residing between the receiving coil and the receiver 34. Each of the separated MR signals is received by one of the inputs 54, and each MR signal is optionally fed to a corresponding one of the converters 58. Each MR signal is demodulated by a corresponding one of the plurality of demodulators 60. The resulting signals are conveyed over the data pipeline 36 to the reconstruction system 38 for image reconstruction as described above.

Figure 9:
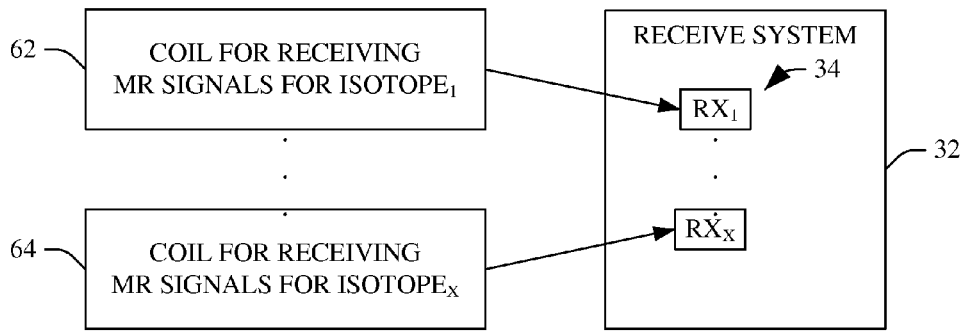
FIG. 9 illustrates a scanner with separate receive coils, each tuned to receive MR signals associated with different isotopes, and separate receivers.
Figure 10:
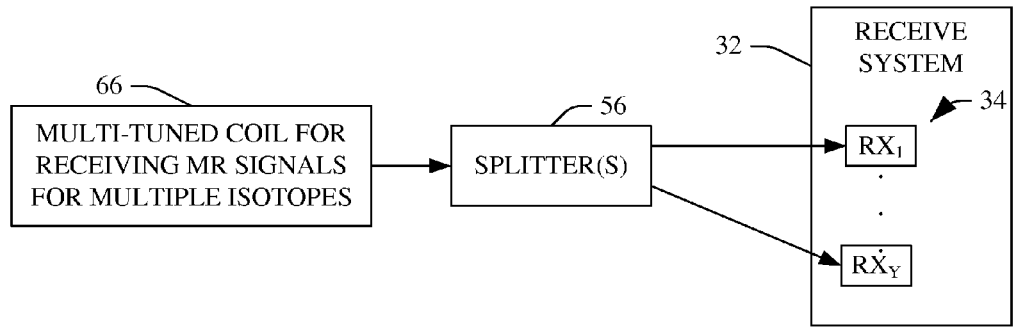
FIG. 10 illustrates a scanner with a multi-tuned receive coil and separate receivers.
Figure 11:
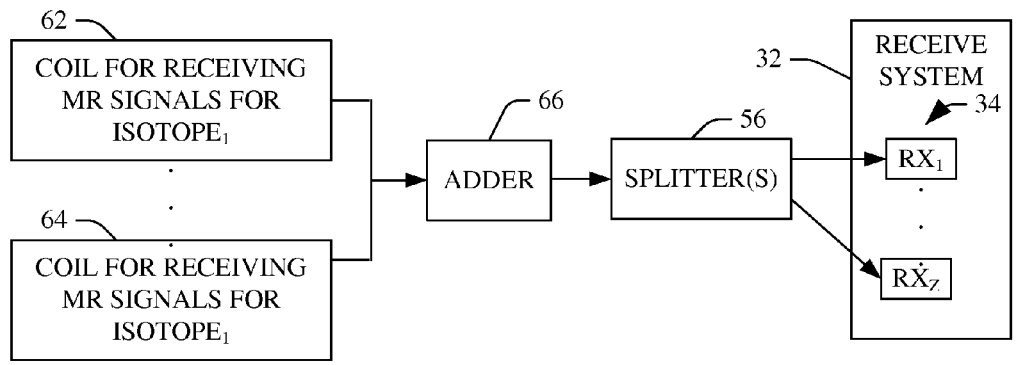
FIG. 11 illustrates a scanner with separate receive coils that are conveyed to separate receivers over a common data path.

FIGS. 9, 10, and 11 illustrate exemplary receive system 32 topologies having more than one receiver 34. Typically, each of the receivers 34 is configured to receive a MR signal associated with a different isotope. However, in some embodiments one or more of the receivers 34 can receive more MR signals associated with more than one isotope.

In FIG. 9, separate receive coils 62 and 64, tuned to receive MR signals associated with different isotopes, are each used to receive and transmit respective MR signals to corresponding receivers 34. In FIG. 10, a multi-tuned coil 66 concurrently conveys multiple MR signals associated with different isotopes. The multiple MR signals are separated by the splitter 56, and the individual MR signals are conveyed to corresponding receivers 34. FIG. 11 illustrates multiple single-tuned coils that share a common transmission path 68 such that multiple MR signals from different coils 62 and 64 and associated with different isotopes are added by an adder 66 and received by the splitter(s) 56, which separates the individual MR signals and conveys the individual MR signal to corresponding receivers 34.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A whole body magnetic resonance medical imaging system that excites multiple nuclei of a human subject through a single RF amplifier, comprising:
    a magnet that generates a main magnetic field in an examination region;
    a gradient coil that superimposes magnetic field gradients on the main magnetic field;
    a SENSE RF coil assembly having a plurality of RF coil elements including a first group of RF coil elements tuned for exciting resonance in a first isotope and a second group of coil elements tuned for exciting resonance in a second isotope, the second isotope being different from the first isotope;
    at least one transmitter that generates multi-nuclei excitation pulses with first and second frequency spectra associated with the first and second isotopes;
    a single amplifier that amplifies the multi-nuclei excitation pulses; and
    a splitter that separates excitation pulses associated with each of the first and second isotopes from the multi-nuclei excitation pulses and sends the individual excitation pulses to the first and second groups of RF coil elements.

2. The system as set forth in claim 1, further including:
    at least one receiver that receives magnetic resonance signals emitted by the excited nuclei; and
    a processing component that processes the received MR signals to generate images of the subject.

3. The system as set forth in claim 1, wherein the at least one transmitter includes a digital transmitter which digitally generates excitation pulses of the first and second energy spectra including updating pulse amplitude, phase, and frequency based on a difference between frequencies of the first and second spectra, and further including:
    a plurality of signal converters that each convert digital excitation pulses associated with the first and second isotopes to analog signals; and,
    an adding unit that sums the analog signals to generate the multi-nuclei excitation pulses in an analog domain for amplification by the amplifier.

4. The medical imaging system as set forth in claim 1, wherein the at least one transmitter includes a digital transmitter which digitally generates excitation pulses of the first and second energy spectra including updating pulse amplitude, phase, and frequency based on a difference between frequencies of the first and second spectra, and further including:
    a combiner that combines digital excitation pulses associated with the first and second isotopes in the digital domain.

5. The system as set forth in claim 1, wherein the first group of RF coil elements receive MR signals from the first isotope and the second group of RF coil elements receive MR signals from the second isotopes and further including:
    an adder which combines the MR signals from the first and second isotopes;
    a common transmission path that carries the combined MR signal to at least one receiver.

6. The medical imaging system as set forth in claim 5, wherein the at least one receiver includes a first receiver tuned to the first frequency spectra and a second receiver tuned to the second frequency spectra and further including:
    a splitter that separates MR signals associated with each of the first and second isotopes from the combined MR signal and sends the separated MR signals to the first and second receivers in accordance with the frequency spectra of the first and second receivers.

7. A medical imaging system that excites multiple nuclei through a single RF amplifier, comprising:
    a magnet that generates a main magnetic field in an examination region;
    a gradient coil that superimposed magnetic field gradients on the main magnetic field;
    at least one RF coil including a plurality of channels that are each independently tuned to one or more isotopes, the at least one RF coil introducing RF pulses into the examination region to selectively excite nuclei within a subject residing in the examination region;

at least one transmitter that generates multi-nuclei excitation pulses associated with at least two different isotopes and two different frequency spectra; and a single amplifier that sends the multi-nuclei excitation pulses to the at least one RF coil applies the RF-field in the examination region.

8. The medical imaging system as set forth in claim 7, wherein the single amplifier is a solid-state RF amplifier.

9. The medical imaging system as set forth in claim 7, wherein the at least two different isotopes include two or more of the following isotopes: 1H, 19F, 13C, and 31P.

10. The medical imaging system as set forth in claim 7, further including:

two or more transmitters, each generating RF pulses associated with a different one of the isotopes;

a combiner that combines the excitation pulses generated by the two or more transmitters to form the multi-nuclei excitation pulse and supplies the multi-nuclei excitations to the single amplifier.

11. The medical imaging system as set forth in claim 7, wherein the splitter provides the separated excitation pulses for each of the isotopes to a corresponding one of the channels in an interleaved manner.

12. The medical imaging system as set forth in claim 7, further including one or more receive coils that receive MR signals from the subject, the one or more receive coils include at least one of following:

a whole body coil;
a head coil;
a local coil;
a SENSE coil;
a quadrature coil; and
a phased array coil.

13. The medical imaging system as set forth in claim 7, further including at least one receiver including:

a plurality of inputs, each of which receives MR signals associated with a different isotope from the plurality of channels;

a plurality of converters, each of which is associated with one of the plurality of inputs and converts MR signals received from its associated input to digital signals; and a plurality of demodulators, each of which is associated with one of the plurality of converters, demodulates the digital signals received from its associated converter, and sends the demodulated signals to the processing component for processing.

14. A medical imaging method, comprising:

generating excitation pulses for each of a plurality of isotopes;

combining the excitation pulses to form multi-nuclei excitation pulses;

sending the multi-nuclei excitation pulses to at least one amplifier which amplifies the multi-nuclear excitation pulses;

splitting the amplified multi-nuclei excitation pulses into pulses associated with each of the plurality of isotopes;

in an interleaved manner, sending the pulses associated with the plurality of isotopes to independently to each of a plurality of multiply-tuned elements of an RF coil such that the coil elements apply RF pulses for each of the plurality of isotopes to a subject to excite nuclei of the plurality of isotopes cyclically.

15. The medical imaging method as set forth in claim 14, further including:

receiving MR signals from excited nuclei within a subject residing in the imaging region; and processing the received MR signals to generate images of the subject.

* * * * *